US011162161B2

(12) United States Patent
Åkesson et al.

(10) Patent No.: US 11,162,161 B2
(45) Date of Patent: Nov. 2, 2021

(54) CUTTING TOOL

(71) Applicant: SANDVIK INTELLECTUAL PROPERTY AB, Sandviken (SE)

(72) Inventors: Leif Åkesson, Alvsjo (SE); Jose Luis Garcia, Stockholm (SE); Kare Finneid, Varby (SE)

(73) Assignee: SANDVIK INTELLECTUAL PROPERTY AB, Sandviken (SE)

( * ) Notice: Subject to any disclaimer, the term of this patent is extended or adjusted under 35 U.S.C. 154(b) by 527 days.

(21) Appl. No.: 16/063,841

(22) PCT Filed: Dec. 16, 2016

(86) PCT No.: PCT/EP2016/081424

§ 371 (c)(1),
(2) Date: Jun. 19, 2018

(87) PCT Pub. No.: WO2017/108610

PCT Pub. Date: Jun. 29, 2017

(65) Prior Publication Data

US 2019/0010583 A1 Jan. 10, 2019

(30) Foreign Application Priority Data

Dec. 21, 2015 (EP) .................................... 15201543

(51) Int. Cl.

| | |
|---|---|
| ***C22C 29/08*** | (2006.01) |
| ***C22C 1/05*** | (2006.01) |
| ***C22C 29/06*** | (2006.01) |
| ***B23B 27/14*** | (2006.01) |
| ***B22F 5/00*** | (2006.01) |
| *C23C 16/32* | (2006.01) |
| *C23C 16/34* | (2006.01) |
| *C23C 16/40* | (2006.01) |

(52) U.S. Cl.
CPC ................ *C22C 29/08* (2013.01); *B22F 5/00* (2013.01); *B23B 27/148* (2013.01); *C22C 1/051* (2013.01);

(Continued)

(58) Field of Classification Search
CPC ......... B22F 5/00; B23B 27/14; B23B 27/148; C22C 29/09; C22C 29/067

(Continued)

(56) References Cited

U.S. PATENT DOCUMENTS 3,647,401 A * 3/1972 Meadows ............... C22C 29/08 75/240
3,660,050 A * 5/1972 Iler ......................... C22C 29/08 419/18

(Continued)

FOREIGN PATENT DOCUMENTS

CN 101263236 A 9/2008
CN 103517777 A 1/2014

(Continued)

*Primary Examiner* — Archene A Turner
(74) *Attorney, Agent, or Firm* — Corinne R. Gorski

(57) ABSTRACT

The present disclosure relates to a cutting tool of a cemented carbide substrate including WC and a binder phase having one or more of Co, Fe and Ni, wherein the cemented carbide also includes a finely dispersed eta phase of Me12C and/or Me6C carbides, where Me is one or more metals selected from W, Mo and the binder phase metals, wherein the substoichiometric carbon content in the cemented carbide is between −0.30 to −0.16 wt %. The disclosed cutting tool will achieve an improved resistance against comb cracks.

12 Claims, 3 Drawing Sheets

10 μm

(52) U.S. Cl.
CPC ...... *C22C 29/067* (2013.01); *B22F 2005/001* (2013.01); *B23B 2222/28* (2013.01); *B23B 2224/04* (2013.01); *B23B 2224/28* (2013.01); *B23B 2224/36* (2013.01); *B23C 2222/28* (2013.01); *B23C 2224/04* (2013.01); *B23C 2224/28* (2013.01); *B23C 2224/36* (2013.01); *B23C 2228/04* (2013.01); *C23C 16/32* (2013.01); *C23C 16/34* (2013.01); *C23C 16/403* (2013.01)

(58) Field of Classification Search
USPC ...................... 419/14, 18; 428/698, 701, 702
See application file for complete search history.

(56) References Cited

U.S. PATENT DOCUMENTS

| | | | | | |
|---|---|---|---|---|---|
| 4,150,195 | A * | 4/1979 | Tobioka | B22F 7/04 419/14 |
| 4,708,037 | A * | 11/1987 | Buljan | B23B 27/148 428/698 |
| 4,843,039 | A | 6/1989 | Akesson | |
| 5,235,879 | A * | 8/1993 | Drougge | C22C 29/08 428/698 |
| RE35,538 | E | 6/1997 | Angstrom et al. | |
| 6,344,265 | B1 * | 2/2002 | Blomstedt | C22C 29/08 428/702 |
| 2002/0051886 | A1 | 5/2002 | Blomstedt et al. | |
| 2010/0098506 | A1 | 4/2010 | Tanaka et al. | |
| 2014/0023546 | A1 * | 1/2014 | Konyashin | B22F 7/008 419/18 |

FOREIGN PATENT DOCUMENTS

| | | | |
|---|---|---|---|
| CN | 104487192 | A | 4/2015 |
| CN | 104611598 | A | 5/2015 |
| EP | 0493352 | A1 | 7/1992 |
| EP | 0182759 | B2 | 12/1993 |
| EP | 1048750 | A1 | 11/2000 |
| EP | 2691198 | B1 | 12/2014 |
| WO | 2012130851 | A1 | 10/2012 |

* cited by examiner

CUTTING TOOL

RELATED APPLICATION DATA

This application is a § 371 National Stage Application of PCT International Application No. PCT/EP2016/081424 filed Dec. 16, 2016 claiming priority to EP 15201543.4 filed Dec. 21, 2015.

TECHNICAL FIELD

The present invention relates to a cutting tool comprising a substrate of cemented carbide which comprises a controlled amount of fine dispersed eta phase.

BACKGROUND

Cutting tools made of cemented carbide are known in the art.

The impact of the carbon content on the cemented carbide structure is well known. A shortage of carbon leads to the formation of eta phase, e.g. $W_6Co_6C$, $W_3Co_3C$, whereas an excess of carbon leads to precipitation of free graphite. The carbon content is usually balanced so that neither eta phase nor graphite is formed. Both eta phase and graphite are considered to be something to avoid. Cemented carbides that contain eta phase are known to be brittle and for that reason, eta phase is usually not desired.

However, there are some cemented carbide grades in the art where eta phase is formed deliberately. In U.S. Pat. No. 4,843,039, a coated cemented carbide insert is manufactured with a low carbon content so that, after sintering, the cemented carbide contains eta phase. The cemented carbide is then subjected to a carburizing treatment so that a gradient surface zone is formed. The surface zone is free from eta phase and has a lower Co content than the inner part of the cemented carbide. However these types of materials have not worked that well for cutting operations. Instead, these types of materials are usually used in mining applications like in EP0182759.

EP2691198 describes a cemented carbide suitable for mining applications which is reinforced by nano particles of eta phase. The grain size of the nano particles are less than 10 nm and the cemented carbide has a magnetic saturation of at least 0.70*201.9 $\mu Tm^3/kg = 141\ \mu Tm^3/kg$.

Comb cracks has been a problem for a long time in some milling applications and it has been an ongoing strive to find a cutting tool material that has an improved resistance against comb cracks and thus has a longer tool life.

It has been discovered that by providing a cemented carbide substrate with a controlled and well distributed eta phase, the resistance against comb cracks can be improved considerably.

SUMMARY

In order to overcome the above disadvantages, a cutting tool having a cemented carbide substrate of WC and a binder phase is provided, the binder phase including one or more of Co, Fe and Ni, wherein the cemented carbide also includes an eta phase including Me12C and/or Me6C carbides where Me is one or more metals selected from W, Mo and the binder phase metals and wherein a substoichiometric carbon content in the cemented carbide is between −0.30 to −0.16 wt %.

A method of making a cutting tool comprising cemented carbide substrate is also provided, the method including the steps of providing powder(s) forming hard constituents comprising WC powder; providing powder(s) selected form Co, Fe and Ni forming a binder phase; providing a milling liquid; and milling, drying, pressing and sintering the powders into a cemented carbide, wherein one or more of W, W2C, Mo or Mo2C is added in such amounts that a carbon content in the sintered cemented carbide is between −0.30 to −0.16 wt % substoichiometric.

DETAILED DESCRIPTION

Figure 1:
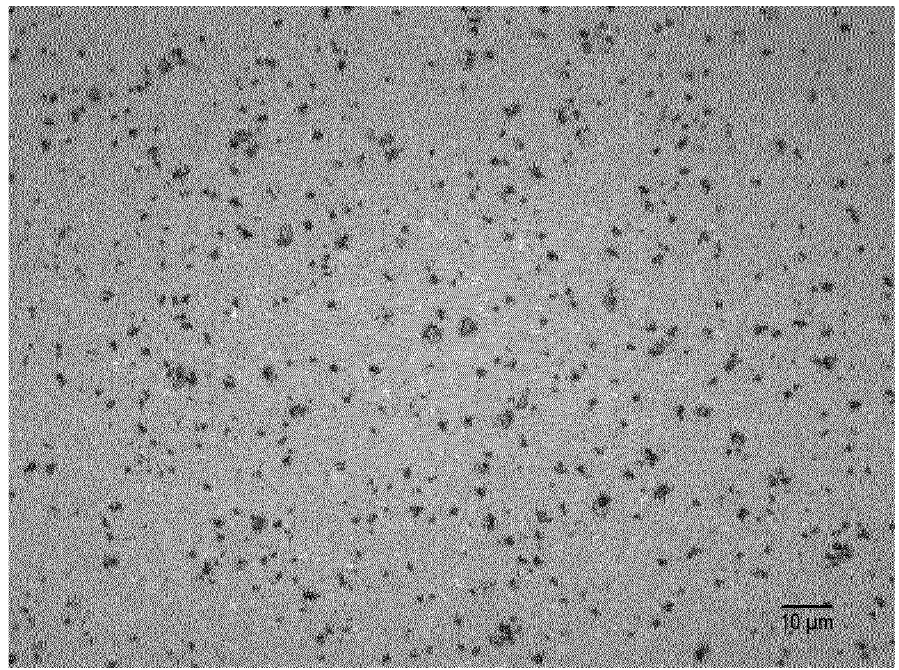
FIG. 1 shows a LOM image of a cemented carbide according to the present invention having a substoichiometric carbon content in the sintered body of −0.17 wt %.

The present invention relates to a cutting tool comprising a cemented carbide substrate comprising WC and a binder phase comprising one or more of Co, Fe and Ni. The cemented carbide substrate further comprises eta phase comprising $Me_{12}C$ and/or $Me_6C$ carbides where Me is selected from W, Mo and one or more of the binder phase metals and wherein the substoichiometric carbon content in the cemented carbide is between −0.30 to −0.16 wt %.

The technical effect, i.e. the improved resistance against comb cracks, is most likely a result of two things, a high W content in the binder phase and the presence of the well distributed eta phase as is disclosed herein. The solubility of W in the binder phase is directly related to the carbon content. The amount of W in the binder increases with decreasing carbon content until the limit for eta phase formation is reached. If the carbon content would decrease even lower, the solubility of W in the binder will not increase further. In some cemented carbide grades where it is beneficial to obtain a high amount of W dissolved in the binder, the carbon content has been kept low but above the limit for eta phase formation.

The cemented carbide according to the present invention has an even lower carbon content so that eta phase is formed. This will result in a cemented carbide having both a high W content in the binder and eta phase.

By eta phase is herein meant carbides selected from $Me_{12}C$ and $Me_6C$ where Me is selected from W, Mo and one or more of the binder phase metals. Common carbides are $W_6Co_6C$, $W_3Co_3C$, $W_6Ni_6C$, $W_3Ni_3C$, $W_6Fe_6C$, $W_3Fe_3C$.

In one embodiment of the present invention, the eta phase comprises both $Me_{12}C$ and $Me_6C$.

In one embodiment of the present invention, the eta phase comprises of >90 vol % $Me_{12}C$, as estimated from XRD measurements.

In one embodiment of the present invention, the eta phase is free from Mo.

In yet another embodiment of the present invention, the eta phase contains Mo. If Mo is present in the cemented carbide, the Mo will replace some of the tungsten in the eta phase.

The average grain size of the eta phase is suitably between 0.1 to 10 μm, preferably between 0.5 to 3 μm. This can be measured in different ways, e.g. by mean linear intercept on a SEM/LOM image or by EBSD.

The distribution of the eta phase should be as even as possible.

In one embodiment of the present invention, the volume fraction of the eta phase is suitably between 2 and 10 vol %, preferably between 4 and 8 vol % and more preferably between 4 to 6 vol %.

In one embodiment of the present invention, the eta phase distribution is the same throughout the whole cemented carbide substrate. By that is herein meant that the cemented carbide does not comprise any gradients of eta phase or zones without eta phase, like e.g. in U.S. Pat. No. 4,843,039.

The cemented carbide in the present invention has a substoichiometric carbon content within certain ranges. Substoichiometric carbon is a measure of the carbon content in relation to the stoichiometric value carbon. The substoichiometric value is a good measurement to use since it is not dependent on other parameters like binder phase content, other carbides etc.

The carbon balance is of importance in order to control the eta phase formation. Suitably the carbon content is between −0.30 and −0.16 wt % substoichiometric carbon, preferably between −0.28 and −0.17 wt % substoichiometric carbon.

The stoichiometric carbon content on the other hand is dependent on other parameters like binder phase content etc. For a powder, prior to sintering, the stoichiometric value is calculated by assuming that the WC is completely stoichiometric, i.e. that the atomic ratio W:C is 1:1. If other carbides are present, also those are assumed to be stoichiometric.

When the stoichiometric carbon content is estimated on a sintered cemented carbide, e.g. consisting of Co and WC, it can either be done based on the amount of added WC raw material, assuming that the atomic ratio W:C is 1:1, or, from measurements on the sintered material, and then from the measured tungsten content calculate the stoichiometric carbon content assuming that the atomic ratio W:C is 1:1.

This means that the term substoichiometric carbon, as used herein, is the total carbon content determined by chemical analysis minus the calculated stoichiometric carbon content based on WC and possible other carbides present in the cemented carbide.

As an example, if the stoichiometric carbon content for a particular cemented carbide is 5.60 wt %, and the same cemented carbide would be made, but with a carbon content of 5.30 wt %, the substoichiometric carbon would be −0.30 wt %.

In order to be able to achieve the well distributed eta phase which is necessary to obtain the improved resistance against comb cracks, achieving the correct carbon content is essential. Hence, it is not just the mere presence of eta phase that will give the improvement in resistance against comb cracks, the eta phase needs to be well distributed in a suitable amount. This is achieved by controlling the carbon balance carefully during manufacturing.

If the carbon content in the sintered cemented carbide is too low, i.e. lower than −0.30 wt % substoichiometric, the amount of eta phase becomes too large and the cemented carbide will be brittle. On the other hand, if the carbon content is higher than the claimed range, i.e. above −0.16 but still in the eta phase forming region, the formed eta phase will be unevenly distributed like in large clusters leading to a decrease in toughness of the cemented carbide. The limits for the range for the substoichiometric carbon content are based on the analyses achieved by the method described in the examples. The difference in carbon content between achieving the unwanted large clusters of eta phase, see e.g. FIG. 3, and achieving the finely distributed eta phase, see FIG. 1, that it is aimed for, can be very small. Being close to that limit requires monitoring the microstructure to make sure that the unwanted large clusters are avoided.

The cemented carbide according to the present invention should have an evenly distributed eta phase, by that is herein meant that the cemented carbide is free from large clusters.

The binder phase is suitably selected from one or more of Fe, Co and Ni, preferably Co, in an amount of 2 to 20 wt % of the sintered body, preferably between 5 to 12 wt % of the sintered body.

In one embodiment of the present invention, when Cr is present in the cemented carbide, some of the Cr is dissolved in the binder phase.

The amount of WC in the cemented carbide is suitably from 80 to 98 wt %. The grain size (FSSS) of the WC in the raw material powder prior to sintering is suitably between 0.1 and 12 μm, preferably between 0.4 to 9 μm.

In one embodiment of the present invention, the cemented carbide also comprises Mo in an amount of from 0.5 to 20 wt %, preferably 0.8 to 5 wt %.

The cemented carbide can also comprise other constituents common in the art of cemented carbides, e.g. carbides, carbonitrides or nitrides of one or more of Ti, Ta, Nb, Cr or V.

In one embodiment of the present invention, the cemented carbide insert is provided with a wear resistant CVD (Chemical vapor deposition) In yet another embodiment of the present invention, the cemented carbide insert is provided with a wear resistant CVD coating comprising several layers, suitably at least a carbonitride layer of e.g. Ti and an $Al_2O_3$ layer, preferably at least one Ti(C,N) layer, an $\alpha$-$Al_2O_3$ and an outer TiN layer.

The coating can also be subjected to additional treatments known in the art, such as brushing, blasting etc.

By cutting tool is herein meant an insert, end mill or drill.

In one embodiment of the present invention, the cutting tool is an insert, preferably a milling insert.

In one embodiment of the present invention, the cemented carbide substrate is used for milling in cast iron, steel or Ti-alloys.

The present invention also relates to a method of making a cutting tool comprising a cemented carbide substrate according to the above. The method comprises the following steps:

providing powder(s) forming hard constituents providing powder(s) selected from Co, Fe and Ni forming the binder phase providing a milling liquid, milling, drying, pressing and sintering the powders into a cemented carbide, wherein one or more of W, $W_2C$, Mo or $Mo_2C$ is added in such amounts that the carbon content in the sintered cemented carbide is between −0.30 to −0.16 wt % substoichiometric.

To achieve the correct carbon content in the final sintered cemented carbide manufacturing, one or more of W, $W_2C$, Mo or $Mo_2C$ is added.

In one embodiment of the present invention, one or more of W and $W_2C$ is added.

In one embodiment of the present invention, the one or more of W, $W_2C$, Mo or $Mo_2C$ powders is pre-milled prior to the addition to the other raw materials.

The exact amount of W, $W_2C$, Mo or $Mo_2C$ depends on the composition of the other raw materials.

Usually some carbon is lost during sintering due to the presence of oxygen. The oxygen will react with carbon and leave as CO or $CO_2$ during sintering thus shifting the carbon balance so that the added amount of one or more of W, $W_2C$, Mo or $Mo_2C$ has to be adjusted. Exactly how much carbon that is lost during sintering depends on the raw material and production techniques used and it is up to the skilled person in the art to adjust the W, $W_2C$, Mo or $Mo_2C$ additions so that the aimed substoichiometric carbon content in the sintered material is achieved.

The powders forming hard constituents are selected from WC and other constituents common in the art of cemented carbides, e.g. carbides, carbonitrides or nitrides of one or more of Ti, Ta, Nb, Cr or V.

In one embodiment of the present invention, the amount of WC added is between 80 and 98 wt % based on dry powder weight. The grain size (FSSS) of the WC powder is suitably between 0.1 and 12 μm, preferably between 0.4 to 9 μm.

In one embodiment of the present invention, the powders forming hard constituents are WC.

In one embodiment of the present invention, at least one part of the powders forming hard constituents are added as a powder fraction made from recycled cemented carbide scrap, comprising mainly the elements W, C and Co.

The powder(s) forming the binder phase are one or more of Co, Ni or Fe, or alloys thereof. The powder(s) forming the binder phase are added in an amount of 2 to 20 wt %, preferably between 5 to 12 wt % based on the dry powder weight.

Any liquid commonly used as a milling liquid in conventional cemented carbide manufacturing can be used. The milling liquid is preferably water, alcohol or an organic solvent, more preferably water or a water and alcohol mixture and most preferably a water and ethanol mixture. The properties of the slurry are dependent on the amount of milling liquid added. Since the drying of the slurry requires energy, the amount of liquid should be minimized in order to keep costs down. However, enough liquid need to be added in order to achieve a pumpable slurry and avoid clogging of the system. Also, other compounds commonly known in the art can be added to the slurry e.g. dispersion agents, pH-adjusters etc.

An organic binder is also optionally added to the slurry in order to facilitate the granulation during the following spray drying operation but also to function as a pressing agent for any following pressing and sintering operations. The organic binder can be any binder commonly used in the art. The organic binder can e.g. be paraffin, polyethylene glycol (PEG), long chain fatty acids etc. The amount of organic binder is suitably between 15 and 25 vol % based on the total dry powder volume, the amount of organic binder is not included in the total dry powder volume.

The slurry comprising powders forming hard constituents and powders forming the binder phase, and possibly an organic binder are suitably mixed by a milling operation, either in a ball mill or attritor mill. Then the slurry is suitably milled in a ball mill or attritor mill to obtain a homogenous slurry blend.

The slurry containing the powdered materials mixed with the organic liquid and possibly the organic binder is atomized through an appropriate nozzle in the drying tower where the small drops are instantaneously dried by a stream of hot gas, for instance in a stream of nitrogen, to form agglomerated granules. For small scale experiments, also other drying methods can be used, e.g. pan drying.

Green bodies are subsequently formed from the dried powders/granules by a pressing operation such as uniaxial pressing, multiaxial pressing etc.

The green bodies formed from the powders/granules made according to the present invention, is subsequently sintered according to any conventional sintering methods e.g. vacuum sintering, Sinter HIP, spark plasma sintering, gas pressure sintering (GPS) etc.

The sintering temperature is typically between 1300 and 1580° C., preferably between 1360 and 1450° C.

In one embodiment of the present invention, the cemented carbide insert is subjected to a heat treatment. Suitably the temperature is between 850 and 1150° C., preferably between 900 and 1050° C. The time at the elevated temperature is suitably between 20 and 2000 minutes, preferably 60 to 1600 minutes. This heat treatment will change to composition of the eta phase, from a mixture of $Me_6C$+$Me_{12}C$ to that the eta phase being mainly $Me_{12}C$.

It is up to the skilled person to adjust the temperature and time for the heat treatment in order to achieve the phase transformation, a lower temperature would required a longer time at the elevated temperature whereas when a high temperature is used, a shorter time will suffice.

In one embodiment of the present invention, the heat treatment is inherently disclosed in the deposition process of a wear resistant coating using CVD technique, i.e. since an elevated temperature is used for the deposition the cemented carbide will be subjected to a heat treatment.

In yet another embodiment of the present invention, the cemented carbide insert is provided with a wear resistant CVD coating. The conventional deposition temperature will lead to the same change in the eta phase as the heat treatment step as described above.

In one embodiment of the present invention a CVD coating is deposited. Suitably, the CVD coating comprises several layers, suitably at least carbonitride layer deposited by MTCVD and a $Al_2O_3$ layer deposited by CVD, more preferably a Ti(C,N) and a $Al_2O_3$ layer. Possibly an outermost color layer for wear detection, e.g. a TiN layer, can also be deposited.

FIG. 1 shows a LOM image of a cemented carbide according to the present invention having a substoichiometric carbon content in the sintered body of −0.17 wt %.

Figure 2:
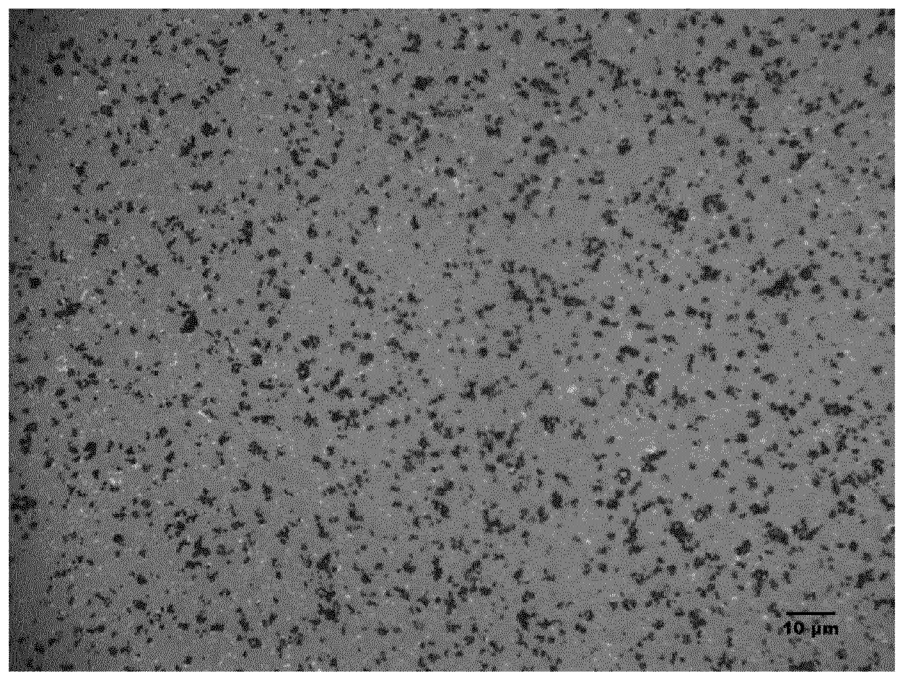
FIG. 2 shows a LOM image of a cemented carbide made from a powder having a substoichiometric carbon content of −0.35 wt %.

FIG. 2 shows a LOM image of a cemented carbide made from a powder having a carbon content which is less than what is claimed, a substoichiometric carbon content of −0.35 wt %.

Figure 3:
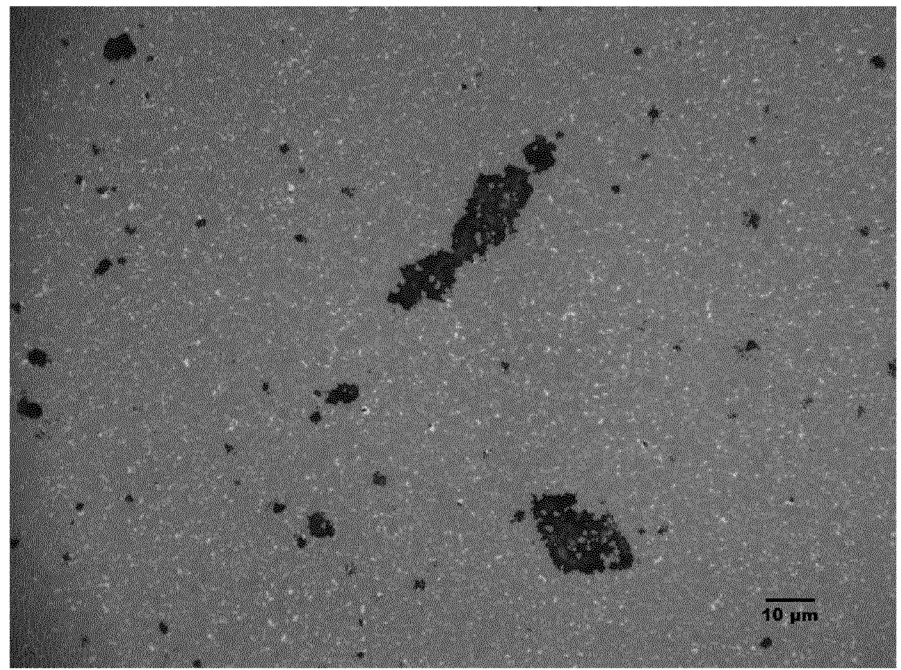
FIG. 3 shows a LOM image of a cemented carbide having a substoichiometric carbon content in the sintered body of −0.15 wt %.

FIG. 3 shows a LOM image of a cemented carbide having a substoichiometric carbon content in the sintered body of −0.15 wt %, i.e. a carbon content that is more than what is claimed.

Figure 4:
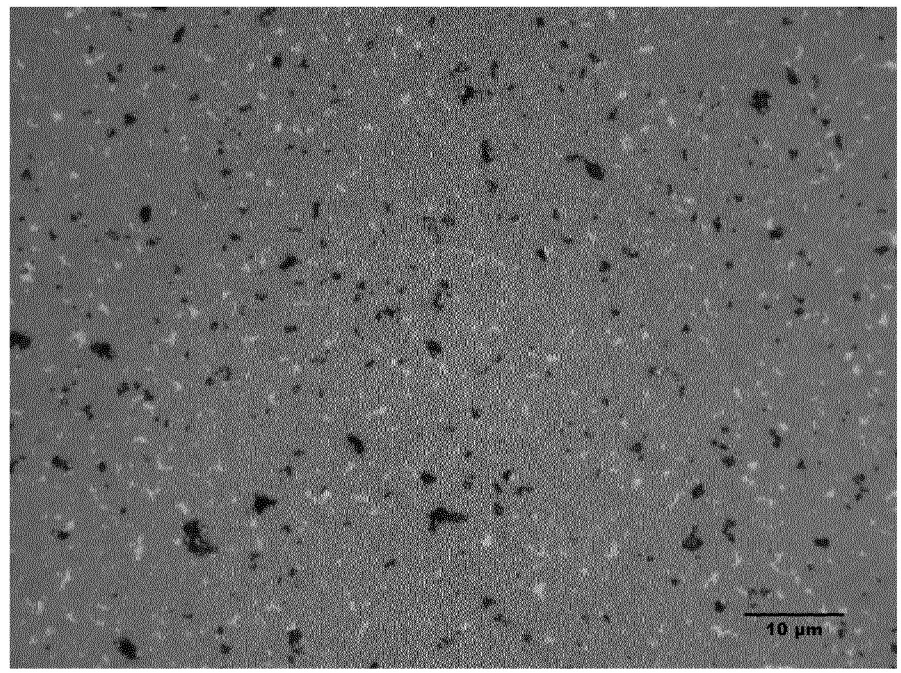
FIG. 4 shows a LOM image of a cemented carbide according to the present invention with Ni as binder made from a powder having a substoichiometric carbon content of −0.13 wt %.

FIG. 4 shows a LOM image of a cemented carbide according to the present invention with Ni as binder made from a powder having a substoichiometric carbon content of −0.13 wt %.

Figure 5:
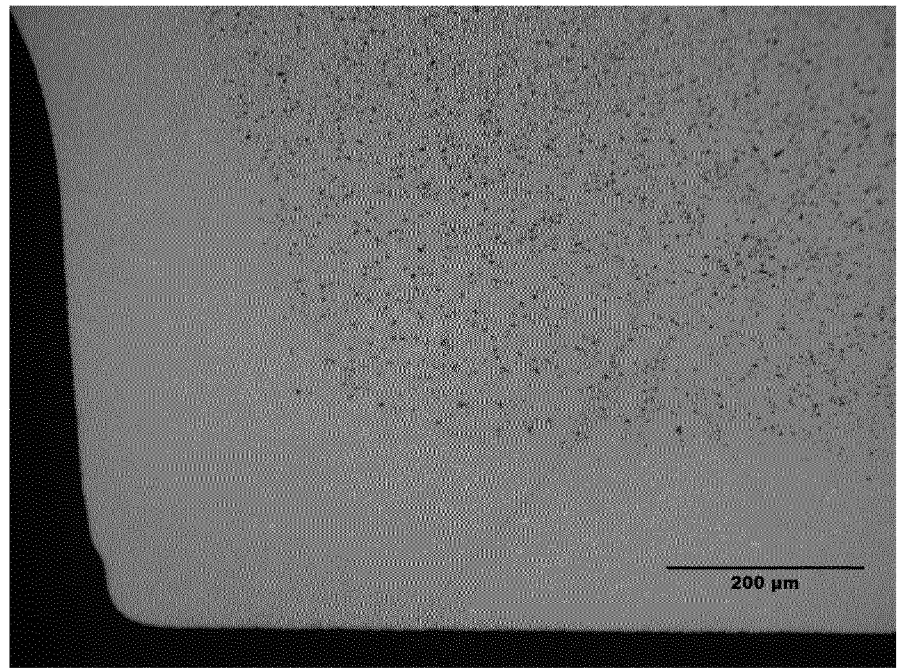
FIG. 5 shows a LOM image of a cemented carbide which has been subjected to a carburizing heat treatment creating a gradient where the substoichiometric carbon content in the sintered body is −0.14 wt %.

FIG. 5 shows a LOM image of a cemented carbide which has been subjected to a carburizing heat treatment creating a gradient where the substoichiometric carbon content in the sintered body is −0.14 wt %.

Figure 6:
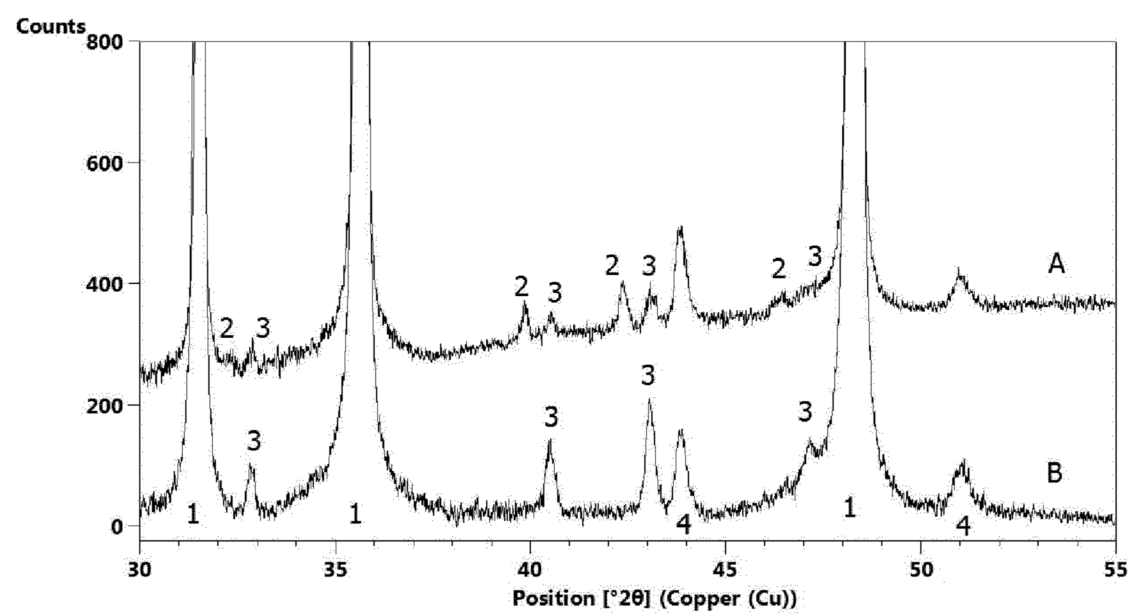
FIG. 6 shows a XRD Diffractogram before (A) and after (B) CVD coating where the numbering of the peaks are 1=WC, 2=$M_6C$, 3=$M_{12}C$, 4=Co.

FIG. 6 shows a XRD Diffractogram before (A) and after (B) CVD coating where the numbering of the peaks are 1=WC, 2=$M_6C$, 3=$M_{12}C$, 4=Co.

Example 1

Cemented carbide inserts are made from raw materials according to Table 1.

TABLE 1

| | Co wt % | WC wt % | WC grain size (μm) (FSSS) | W addition wt % | $W_2C$ addition wt % | Substoichiometric carbon content in powder (wt %) |
|---|---|---|---|---|---|---|
| Invention 1 | 7.4 | Balance | 1.37 | — | 4.12* | −0.13 |
| Invention 2 | 7.4 | Balance | 1.37 | — | 4.12 | −0.13 |
| Invention 3 | 7.4 | Balance | 1.37 | 1.9* | — | −0.13 |
| Invention 4 | 7.4 | Balance | 1.37 | 1.9 | — | −0.13 |
| Reference 1 | 7.4 | Balance | 1.37 | — | 9.12 | −0.28 |
| Reference 2 | 7.4 | Balance | 1.42 | 1.14 | — | −0.09 |

*Premilled for 4 hours

The powders were, together with a milling liquid (water/ethanol with a ratio of 9/91) and an organic binder, 2 wt % PEG, the amount of PEG is not included in the dry powder weight), milled in a ball mill for 8 hours. Then the slurry was pan dried. The agglomerates were then pressed into a green body which then was sintered in 40 mbar Ar+CO at 1410° C.

The sintered pieces were then analyzed with regard to the carbon content and parameters like hardness, amount of eta phase etc. was measured. The amount of eta phase was determined by image analysis using the software Image J using the setup "Automatic". The images used for the analysis was LOM images with a magnification of 1000× and 2000×, two measurements were done at each magnification and the values in Table 2 are an average value of these. The value in the table is an average from a total of four image analyses performed on two images, 2 measurements on each image. The magnetic-% Co was determined by analyzing with a Foerster Koerzimat CS 1.096 from Foerster Instruments Inc. using the standard DIN IEC 60404-7. The results are shown in Table 2.

The magnetic properties of cemented carbides are determined by the ferromagnetic properties of the Co binder phase, whereas the hard phases (WC etc.) are non-ferromagnetic. The contribution of the Co in the binder phase to the measured magnetic moment is always only a percentage of the (theoretical) magnetic moment of 100% pure Co. This can, for example, be due to that some metals in the cemented carbide composition, such as W and Cr, can dissolve in the Co binder phase during sintering and reduce the ferromagnetic properties of the Co binder phase compared to pure Co. Therefore, by the term magnetic-% Co is meant the magnetic moment measured in relation to the magnetic moment of pure Co.

The stoichiometric carbon content in the sintered material is calculated by first measuring the total carbon content by using a LECO WC-600 instrument, for this analysis, the sample was crushed prior to the analysis. The accuracy of the values is ±0.01 wt %. The Co content is measured with XRF (X-ray fluorescence) using a Panalytical Axios Max Advanced instrument. By subtracting the cobalt and carbon amounts from the total weight of the sample, the W content is achieved which is used to calculated the stoichiometric carbon content, assuming the WC has a 1:1 ratio.

By subtracting the stoichiometric carbon content from the total carbon as measured by the LECO WC-600 instrument, the substoichiometric carbon content is achieved. As can be seen in Table 2, the substoichiometric carbon content in the sintered material differs from that in the powder. That is due to that some part of the carbon reacts with oxygen, which is an impurity in the raw materials, which outgas as CO or $CO_2$ during sintering, and reduces the total final C content of the alloy.

TABLE 2

| | Vol % eta phase | magnetic-% Co | Substoichiometric carbon in sintered body (wt %) | Hardness (HV3) ±10 |
|---|---|---|---|---|
| Invention 1 | 5.0 | 69 | −0.23 | 1630 |
| Invention 2 | 4.8 | 69 | −0.20 | 1620 |
| Invention 3 | 5.4 | 69 | −0.27 | 1600 |
| Invention 4 | 5.0 | 69 | −0.26 | 1610 |
| Reference 1 | 10.4 | 60 | −0.37 | 1640 |
| Reference 2 | clusters | 71 | −0.15 | 1590 |

Looking at the microstructure of Invention 1-4 shows that the type of W or $W_2C$ addition is of less importance for the microstructure. A well distributed eta phase is shown in all samples. In FIG. 1, a LOM image of Invention 1 as made according to example 4 is shown.

Reference 1, having a substoichiometric carbon below the claimed range, shows an increased amount of eta phase which is not desired since it will make the cemented carbide brittle. In FIG. 2, a LOM image of Reference 1 is shown.

Reference 2, having a substoichiometric carbon above the claimed range, shows an uncontrolled eta phase formation unevenly distributed in clusters. In FIG. 3, a LOM image of Reference 2 is shown.

Example 2

A cemented carbide was made in the same manner as described in Example 1, with the difference that the cobalt was replaced with 6 wt % Ni and the substoichiometric carbon content in the powder prior to sintering was −0.13 wt %.

A LOM image of the sintered material (FIG. 4) shows that even if Co is replaced by Ni, the same microstructure can be achieved with respect to the eta phase.

Example 3

A cemented carbide insert were manufactured in a similar manner as in Example 1, having the same composition as Invention 1.

The cemented carbide insert was then subjected to a heat treatment in a carburizing environment in 1350° C., for 15-20 minutes. A surface zone, in average about 200 μm thick was then formed which was eta phase free and also had a lower Co content than the inner parts of the insert. The substoichiometric carbon content in the sintered body was −0.14 wt %.

A LOM image of this sample 1 is shown in FIG. 5.

Example 4

Cemented carbide inserts were made from the same raw materials as Invention 1 in Table 1 but with a substoichiometric carbon of −0.11 wt % in the powder. The inserts were made in the same manner as in Example 1 with the difference that the powders were spray dried instead of pan dried. One of the inserts was then coated with a CVD coating comprising a first thin TiN layer, followed by 2.7 μm Ti(C,N) deposited at 885° C. and then a 2.7 μm $\alpha$-$Al_2O_3$ and a outermost 1.2 μm TiN layer, both deposited at 1000° C. 4 h+4 h (about 8.5 h total).

TABLE 3

| | Substoichio-metric carbon in sintered cemented carbide (wt %) | Coating | Subcarbides detected by XRD |
|---|---|---|---|
| Invention 6a | −0.17 | Uncoated | (Co, W)$_6$C + (Co, W)$_{12}$C |
| Invention 6b | −0.17 | CVD Ti(C, N) + $\alpha$-$Al_2O_3$ | Mainly (CoW)$_{12}$C |

It has been observed that a phase transformation occurs when the cemented carbide substrates are subjected to the CVD deposition process. Prior to deposition, the subcarbides are a mixture of $(CoW)_6C$+$(CoW)_{12}C$ but after the deposition the subcarbides are mainly $(CoW)_{12}C$. It is known that the high temperature (above 1250° C.) equilibrium, the subcarbide phase is $(CoW)_6C$ and that below 1250° C. the most stable subcarbide in equilibrium with Co and WC is $(CoW)_{12}C$. Since the CVD process was done at 1050° C. for a relative long time, a phase transformation of $(CoW)_6C$ into $(CoW)_{12}C$ took place. This is clearly shown in FIG. 6 showing the XRD Diffractogram.

Example 4 (Working Example)

In this test, a face milling test, a coated cemented carbide according to the present invention has been compared to three inserts according to prior art, all having the same geometry. The test has been performed in Gray cast iron under wet conditions with the following cutting parameters:

Vc: 220
Fz: 0.35
Ap: 3
Ae: 60+60 mm

Tool life criterion was chipping/crack to a depth of 0.35 mm. The number of passes below is an average of 3 tests each.

Comparative 1 is an insert that has previously been used for these types of applications. The volume fraction of gamma phase in Comparative 1 is about 2 vol %.

Comparative 2 is aimed to be the same cemented carbide as in Invention 1 but without the eta phase. The reason why the cobalt content differs between Invention 1 and Comparative 2 is that, when eta phase is formed, Co is consumed since Co is part of the eta phase. That means that the amount of metallic cobalt, i.e. the amount of cobalt that functions as a binder in the cemented carbide, will be less than the amount added unless extra cobalt is added to compensate. For Invention 1, 7.4 wt % Co is the total amount of Co that has been added, whereas the amount of metallic cobalt in Invention 1 has been estimated to be around 6 wt %. Comparative 3 is aimed to be a cemented carbide similar to Comparative 2 which presents a substoichiometric carbon content above the claimed range. Comparative 4 is the sample from Example 3 where a sintered cemented carbide has been subjected to a carburizing treatment.

All inserts have been provided with the same coating, i.e. the CVD coating described in Example 4.

TABLE 4

| | Composition | Substoichio-metric carbon in sintered body (wt %) | Eta phase | Number of passes |
|---|---|---|---|---|
| Invention 1 | 7.4 wt % Co balance WC | −0.17 | yes | 12 |
| Comparative 1 | 7.6 wt % Co, 1.23 wt % TaC, 0.30 wt % NbC balance WC, | −0.09 | No | 7 |
| Comparative 2 | 6.0 wt % Co balance WC | −0.09 | No | 8 |
| Comparative 3 | 6.0 wt % Co balance WC | −0.13 | No | 9 |
| Comparative 4 | 6.0 wt % Co balance WC | −0.14 | Yes, in bulk | 5 |

As can be seen in Table 4, the inserts according to the present invention have a longer tool life as compared to the comparative cutting tools, Comparative 1-4.

The invention claimed is:

1. A cutting tool comprising a cemented carbide substrate comprising WC and a binder phase including one or more of Co, Fe and Ni, wherein the cemented carbide also includes an eta phase comprising $Me_{12}C$ and/or $Me_6C$ carbides where Me is one or more metals selected from W, Mo and the binder phase metals and wherein a substoichiometric carbon content in the cemented carbide is between −0.30 to −0.16 wt %, wherein the eta phase distribution is the same throughout the whole cemented carbide substrate, and wherein a grain size of the eta phase is between 0.4 to 9 μm.

2. The cutting tool according to claim 1, wherein the substoichiometric carbon content in the cemented carbide is between −0.28 to −0.17 wt %.

3. The cutting tool according to claim 1, wherein the amount of eta phase in the cemented carbide is between 2 to 10 vol %.

4. The cutting tool according to claim 1, wherein the eta phase grain size is 0.5 to 3 μm.

5. The cutting tool according to claim 1, wherein the binder phase content is 2 to 20 wt %.

6. The cutting tool according to claim 1, wherein the binder phase is cobalt.

7. The cutting tool according to claim 1, wherein the cemented carbide substrate is provided with a wear resistant CVD coating.

8. The cutting tool according to claim 1, wherein the cemented carbide substrate is provided with a CVD coating comprising at least a Ti(C,N) layer and a $Al_2O_3$ layer.

9. A method of making a cutting tool comprising cemented carbide substrate, the method comprising the steps of:

providing powder(s) forming hard constituents comprising WC powder, wherein a grain size of the WC in the powder prior to sintering is between 0.4 to 9 μm;

providing powder(s) selected form Co, Fe and Ni forming a binder phase;

providing a milling liquid; and milling, drying, pressing and sintering the powders into a cemented carbide, wherein one or more of W, $W_2C$, Mo or $Mo_2C$ is added in such amounts that a substoichiometric carbon content in the sintered cemented carbide is between −0.30 to −0.16 wt %.

10. The method according to claim 9, wherein the substoichiometric carbon content in the cemented carbide is between −0.28 to −0.17 wt %.

11. The method according to claim 9, wherein W or $W_2C$ is added.

12. The method according to claim 9, wherein the cemented carbide substrate is provided with a wear resistant CVD coating.

* * * * *